(12) United States Patent
Van Geloven et al.

(10) Patent No.: US 8,138,768 B2
(45) Date of Patent: Mar. 20, 2012

(54) SENSING CIRCUIT FOR DEVICES WITH PROTECTIVE COATING

(75) Inventors: Johannes A. J. Van Geloven, Eindhoven (NL); Robertus A. M. Wolters, Eindhoven (NL); Nynke Verhaech, Arnhem (NL)

(73) Assignee: NXP B.V., Eindhoven (NL)

( * ) Notice: Subject to any disclaimer, the term of this patent is extended or adjusted under 35 U.S.C. 154(b) by 427 days.

(21) Appl. No.: 12/523,840

(22) PCT Filed: Jan. 20, 2008

(86) PCT No.: PCT/IB2008/050292
§ 371 (c)(1),
(2), (4) Date: Jul. 20, 2009

(87) PCT Pub. No.: WO2008/093273
PCT Pub. Date: Aug. 7, 2008

(65) Prior Publication Data
US 2010/0090714 A1   Apr. 15, 2010

(30) Foreign Application Priority Data
Jan. 30, 2007   (EP) .................................. 07101426

(51) Int. Cl.
*G01R 27/08* (2006.01)
*H01L 23/52* (2006.01)
(52) U.S. Cl. ..................... 324/629; 324/525; 324/551
(58) Field of Classification Search ............... 324/629, 324/525, 551, 537
See application file for complete search history.

(56) References Cited

U.S. PATENT DOCUMENTS

| 4,392,378 A | 7/1983 | Pitches et al. |
|---|---|---|
| 5,389,738 A | 2/1995 | Piosenka et al. |
| 6,588,672 B1 | 7/2003 | Usami |
| 7,024,565 B1 | 4/2006 | Beiley et al. |
| 2005/0116307 A1 | 6/2005 | De Jongh et al. |
| 2008/0139087 A1* | 6/2008 | Togawa et al. .................... 451/8 |
| 2009/0036794 A1* | 2/2009 | Stubhaug et al. ............. 600/547 |

FOREIGN PATENT DOCUMENTS

| DE | 10065339 A1 | 7/2002 |
|---|---|---|
| EP | 0698780 A | 2/1996 |
| WO | 03/046986 A | 6/2003 |

* cited by examiner

*Primary Examiner* — Vincent Q Nguyen

(57) ABSTRACT

An integrated circuit has an inhomogeneous protective layer or coating over a circuit to be protected, and a sensing circuit (80) arranged to sense a first impedance of a part of the protective coating compared to a reference impedance (CO) located on the integrated circuit. The sensing circuit is able to measure a change in the first impedance, e.g. caused by tampering. The sensing circuit has an amplifier (OTA) having a feedback loop, such that the impedance being sensed is in the feedback loop. The sensing circuit can be incorporated in an oscillator circuit (OTA, Comp) so that the frequency depends on the impedance. Where the impedance is a capacitance, sensing electrodes adjacent to the protective layer or coating, form the capacitance. The electrodes can be arranged as selectable interdigitated comb structures, so that the protective layer or coating extends in between the teeth of the comb structures.

23 Claims, 4 Drawing Sheets

SENSING CIRCUIT FOR DEVICES WITH PROTECTIVE COATING

FIELD OF THE INVENTION

This invention relates to integrated semiconductor devices having a protective coating, and to methods of using and methods of making such devices.

BACKGROUND OF THE INVENTION

In order to protect secret data or secret circuitry on an integrated circuit (IC) against reading or tampering by invasive physical attacks, it is known to cover the IC with an inhomogeneous coating. The coating is opaque and chemically inert. It is also known to increase security of encryption devices having a data key, by not storing the key in the device but generating it only at the time when needed and deleting it afterwards. In particular in this case, the key can be derived from capacitance measurements on the inhomogeneous coating. If the coating has been tampered with or removed or replaced, the capacitance or other characteristic will be different and the key cannot be generated. In order to enable this, a measurement circuit for measuring the capacitance values is needed. Sensors in the form of electrodes are embedded in or near the coating. The measured values of the sensors can be used to generate a physical identification code, as no programming is needed to generate this particular ID code, and to detect attacks. Attacks or changes to the coating will change the measured values and so also the ID code.

It is known from patent application WO2003-046986 to provide a circuit covered by a secure coating in the form of a passivation structure. It is provided with a first and a second security element which each comprise local areas of the passivation structure, and with a first and a second electrode. The security elements have first and second impedances, respectively, which impedances differ, as the passivation structure has an effective dielectric constant that varies laterally over the circuit. Actual values of the impedances are measured by measuring means and transferred to an access device by transferring means. The access device comprises or has access to a central database device for storing the impedances. The access device compares the actual values with the stored values of the impedances in order to check the authenticity or the identity of the semiconductor device.

The various elements are coupled via transistor switches to an oscillator. The oscillator provides a signal to a binary counter, whose frequency depends on the capacitance of the selected element being measured. The counter compares this frequency with a signal having a clock frequency. This signal originates from oscillator with a reference capacitor and a reference resistor which both have a precise and well-known value. The result of the comparison in the-binary-counter is a digitized signal which can be stored. The digitized signal represents the actual value of the impedance of the measured security element. The actual value may be present in any kind of SI-unit, or else in any semiconductor specific value, as it will not be compared with any externally measured value. A selection unit controls the transistors for selecting which security elements is to be measured. It will send signals such that one of the switches is on, to measure one of the security elements, or may switch on a number of the switches so that a desired combination of security elements may be measured, so as to minimize the number of measuring steps or to complicate the security.

One of the security elements can be a reference element whose actual value is known. It may be realized, for example, by implementing this element in the interconnect structure; especially if the passivation structure comprises a security layer with particles that are distributed inhomogeneously. This reference security element can be used for optimizing the measuring results, or for calibrating measured counts and converting them to actual values.

Another known tamper detection circuit is shown in U.S. Pat. No. 7,024,565. This shows another capacitor measuring circuit for detecting tampering of a passivation layer. Two current sources produce substantially identical, constant current through a range of load conditions. A reference capacitor is provided which is coupled to one current source. A voltage across the reference capacitor will increase approximately linearly due to the application of constant current over time to reference capacitor. The rate at which the voltage increases is determined by the capacitance of capacitor. A second capacitor is coupled to the second current source. The second capacitor is defined by conductive elements arranged adjacent to the passivation layer. A constant current applied to this capacitor will increase a voltage across the capacitor approximately linearly over time. The rate at which this voltage increases may be determined by the capacitance of capacitor. One side of each capacitor is coupled to ground, and the other side to inputs of a comparator. When either of the voltages across the capacitors exceeds a predetermined voltage level (logical "high"), an OR gate asserts an enable signal to a comparator, to produce an output signal value indicating if one signal has a value less than the other, or alternately if one signal has a value greater than the other, to indicate tampering.

SUMMARY OF THE INVENTION

An object of the invention is to provide improved integrated semiconductor devices having a protective coating, or methods of using or methods of making such devices. According to a first aspect, the invention provides:

An integrated circuit having a circuit to be protected, a protective coating over the circuit to be protected, and a sensing circuit arranged to sense a first impedance of a part of the protective coating compared to a reference impedance on the integrated circuit. The sensing circuit should be able to measure a change in the first impedance or the reference impedance caused by tampering. Preferably, only the impedance of the protective layer is measured in the sensing measurement and not the stray impedances, e.g. capacitances to ground or to power lines.

The sensing circuit can be designed to derive a secret key value from the measured first impedance whereby a measured change in the key value is an indication of tampering.

The sensing circuit may also comprise an amplifier having a feedback loop, such that the impedance being sensed is in the feedback loop.

Amongst other consequences, having the impedance in the feedback loop helps avoid grounding one side of the impedance being sensed, which helps reduce stray impedances.

Any additional features can be added, and some such additional features are described below.

Other aspects of the invention include methods of using such an integrated circuit to measure the impedance by operating the amplifier, to determine the impedance. Another aspect provides a method of manufacturing such an integrated circuit. The method can have the step of measuring the impedance and recording the measurement externally, with an identifier of the integrated circuit, for use in validating future measurements from the same integrated circuit.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DESCRIPTION OF THE PREFERRED EMBODIMENTS

Figure 1:
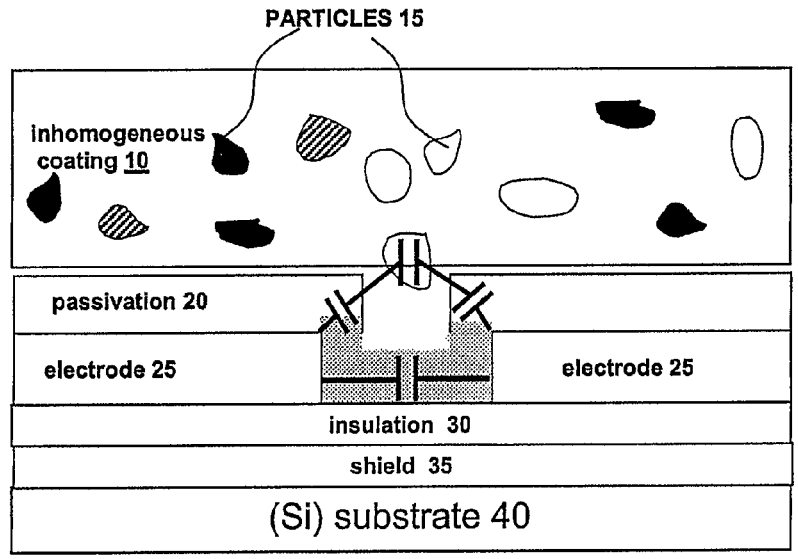
FIG. 1 shows an arrangement of capacitor plates and coating, for use with embodiments of the invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The protection of chips using physically unclonable functions (PUFs) is considered important, particularly for applications such as smartcard ICs. A coating-PUF can be based on a meta-aluminum phosphate coating (MAP), particles of $TiO_2$ and TiN and capacitors. The PUFs actually need to meet several requirements: first of all, the coating must be sufficiently inhomogeneous to ensure that the capacitive elements will have a random value and not an average value. Secondly, the value of the PUFs may only vary within a prescribed range, so as to give the same measurement result independent of any variations such as temperature, variations in the applied voltage and the like.

The two measurement methods disclosed in pending application WO2003-046986 turn out to be more sensitive to temperature than is desirable for some applications (see page 5). The first method disclosed (comparison of values of oscillators) is a comparison in the time-domain, from which difference between a reference capacitor and a measured capacitor is to be calculated. The second method involves sending a square wave of known frequency and amplitude to the element and measures a current. This is not a relative measurement but an absolute measurement. Additionally, it appears that a square wave, that necessarily contains multiple frequency components, is disadvantageous and the wave preferably has a truly sinusoidal shape Such a truly sinusoidal wave cannot be generated very easily on-chip, as compared to a block-shaped wave.

To provide an improved structure and measurement method, at least some of the embodiments of the invention have a sensing circuit arranged to measure a first impedance compared to a second or reference impedance. These impedances are preferably formed from one or more layers or coatings that would have to be damaged in order for access to be gained to an underlying electronic component or circuit. The reference impedance can be formed independently or from the same layer or coating as the first impedance or could be formed from another layer or coating. There can be more than one first impedance and there can be more than one reference impedance. The sensing circuit may comprise an amplifier having a feedback loop, such that the impedance being sensed is in the feedback loop.

Some of the additional features which will be described are as follows. The sensing circuit can be incorporated in an oscillator circuit. This is particularly suitable for providing an output to digital circuitry, though other arrangements are included within the scope of the invention. The first and/or second (reference) impedances can be capacitances, e.g. comprising two electrodes adjacent to the relevant layer or coating, though in principle it can be inductive or resistive, or combinations of these. Any of the coatings or layers can be an inhomogeneous coating. An inhomogeneous coating is preferred in accordance with embodiments of the present invention in order to get more variation in impedance values. This is preferred for getting more secret key bits per sensor and also to improve detection.

The integrated circuit, e.g. the sensing circuit can have the reference impedance, e.g. a reference capacitor, which can enable measurements relative to this impedance, e.g. capacitor. This can help address the problem that the first impedance should be measured in a reproducible manner, in other words minor variations of the temperature should not lead to major changes in the measured impedance, e.g. capacitance. The oscillator can comprise the amplifier coupled to a comparator, the comparator being within the feedback loop. This is one way to create an oscillator, though others are conceivable. The reference impedance, e.g. reference capacitor, can be coupled in parallel with the first impedance being sensed. This enables the measurements to be taken without a need for switching. The sensing circuit can be arranged to measure a number of first impedances of different parts of the coating, and have selectors for selecting which parts are in the feedback loop. The sensing electrodes can be arranged in a highest of a number of metal layers. There can be a shield layer between the sensing electrodes and the circuit being protected. The sensing electrodes can be arranged as interdigitated comb structures. The electrodes can be arranged so that the layer or coating extends in between the electrodes. This can help to obtain inhomogeneous impedance values, and make the measured first and/or second impedance, e.g. capacitance, sufficiently large and suitable for the sensor architecture. Furthermore it can help enable detection of local variations in the coating, for detecting local attacks that result in changes in the layer or coating or layers or coatings, and can be efficient in size and easily connected in an array.

The sensing electrodes can be arranged in selectable banks of multiple pairs of electrodes. The selectable sensing elements can be arranged such that connection wires to non-selected impedance sensors, e.g. capacitive sensors, are left floating. This can help enable sensing of changes in the coating above the wires. The measuring step can involve driving an oscillator and counting the number of oscillations. For example, the oscillation period can be measured. The oscillation period is preferably bigger than the oscillation period of a system clock, e.g. a factor of 10 or 100 longer than the system clock period. Counting the number of system clocks which fit into an oscillation period of the oscillator, e.g. using a counter provides a measure of the capacitance. Counting over more than one oscillation period, e.g. over 64 periods, can increase the accuracy.

The method can have the step of converting the measured first impedance (either absolute or relative value) to a value such as a secret key for an encryption or a decryption algorithm. The method can have the step of transferring the key or the impedance off the integrated circuit and validating the key or the impedance externally. The method can have the step of selecting one or several different parts of the coating to be measured.

FIG. 1, Coating and Sensing Electrodes

The protection of integrated circuits by active coatings or layers is known and need not be described in detail. The layer or coating should such that each device has a different impedance, which is hard to recreate once the layer or coating, or any part of it, is damaged. One way of achieving this is to make the layer or coating inhomogeneous. This can be implemented by a layer or coating which contains particles with different dielectric constants. By placing two capacitor plates next to each other in a metal layer directly under the coating, the fringe capacitance between these plates is partly determined by the layer or coating and therefore influenced by the particles in the layer or coating. FIG. 1 shows an example. A substrate 40 is a basis for the circuit to be protected. A shield layer 35 serves to shield the sensing circuit from interference, e.g. coming from circuitry below the shield or from the substrate. An insulation layer 30 separates the electrodes 25 from other layers. A passivation layer 20 covers the electrodes. The protective layer or coating 10 is formed over the passivation layer. The layer or coating 10 is an inhomogeneous layer, e.g. containing randomly distributed particles 15 of differing characteristics. The electrodes are coupled to other parts of sensing circuitry as will be explained below, to measure the impedance of part of the coating. As shown in FIG. 1, there will be impedance in the form of capacitance between the two electrodes shown, both due to the thin passivation layer, and due to the coating particularly dependent on the properties of the coating near to the gap between the electrodes. Also other particles can be used in accordance with the present invention.

By careful placement of the capacitor plates and by accurate measurement of the capacitance between them, local coating properties can be detected. Changes in the coating can be detected too. Finally these measurement results can be transformed into a value, e.g. to a secret key.

Some of the embodiments are notable for the combination of:

a sensor structure of electrodes (e.g. interdigitated in some embodiments) present on one side of the coating, and a sensor architecture including an amplifier and a closed loop, such that the output of the amplifier is partly fed back to the input through the impedance element, e.g. capacitance element to be measured.

An aspect of the present invention is a measurement method for an impedance such as a capacitor, with various types of security coatings, so as to get a reliable result, e.g. by comparing the measured first impedance with a reference impedance located on the integrated circuit. The present invention includes within its scope an interdigitated electrode structure with a measurement arrangement according to the present invention. This combination can help achieve better results.

Figure 2:
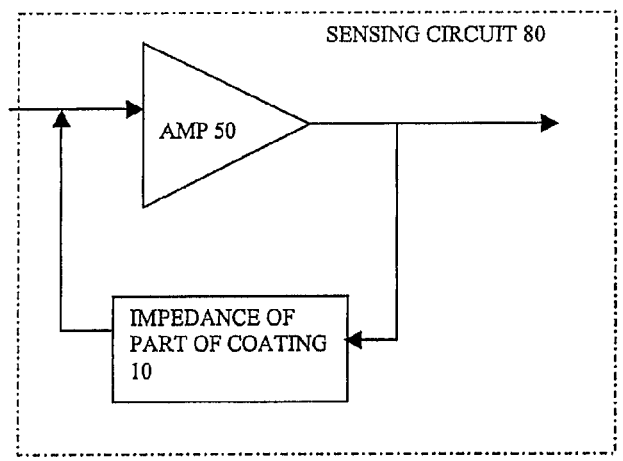
FIG. 2 shows a schematic view of a sensing circuit according to a first embodiment of the invention.
Figure 3:
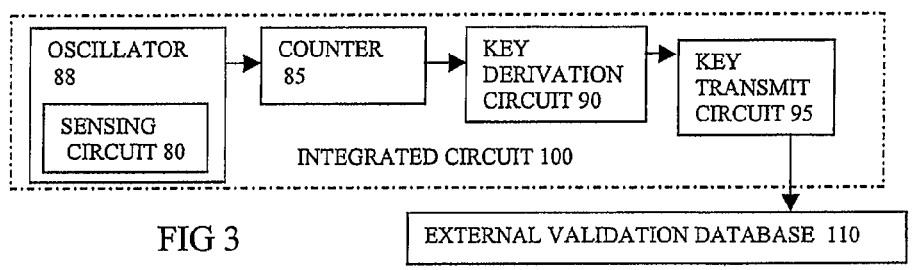
FIG. 3 shows a schematic view of another embodiment.

FIGS. 2, 3 Sensing Circuit

An embodiment of the invention, illustrated in FIG. 2, shows a sensing circuit 80 having an amplifier 50, and a feedback loop. The circuit 80 has power lines and a ground (not shown specifically). The feedback loop includes the impedance of part of the coating to be measured, and optionally other components. This can be achieved using the electrodes and other structure of FIG. 1, or in other ways. Notably, FIG. 2 involves a two port or floating measurement system so that only the impedance between the electrodes plays a role in the measurement and not the stray capacitances to ground or other fixed voltages such as e.g. the stray capacitance to the shield. Thus, only the actual impedance between the electrodes is measured, without stray components.

FIG. 3 shows how the sensing circuit can be incorporated with other parts. The sensing circuit has power lines and a ground (not shown specifically). The sensing circuit can be part of an oscillator 88. In principle, the amplifier output can be converted to a digital value in other ways, without an oscillator, such as by an analog to digital converter, then digital processing used to determine gradients of the output and hence an impedance value. Typically it is more convenient to use a frequency of oscillation to represent the impedance being sensed. A counter 85 can be used to convert the frequency to a digital value. This can be used by a key derivation circuit 90, to avoid sending the sensed value externally. The key can be derived according to the count, and then be transmitted off chip by a transmit circuit 95, e.g. in encrypted form. The key can be used by applications, and it can be validated externally by comparison to a secure validation database 110. This database can store a key value obtained during manufacture of each chip, together with an identifier for each chip. If the chip has been tampered with, the impedance being sensed will change, and the resultant key will differ from the key held for that chip, in the validation database. Hence the validation will fail.

Other embodiments with a secure inhomogeneous coating can have at least some of the following features:

Measuring the coating properties with impedance, e.g. capacitive sensors placed in the highest available metal layer.

Implementing the sensors as comb structures that are ideal for optimal detection of local variations in the coating, optimal for detecting local attacks that result in changes in the coating, efficient in size and can be easily connected in an array.

Placing the sensors in an array over the protected area in the proposed floor plan that can be extended in bigger areas and multiple banks.

Putting the sensors on top of existing circuitry with a shield (35) in between. The shield should be connected to a stable voltage to avoid crosstalk. Also supply lines (power and/or ground) can be used as shield.

Implementing the measurement circuit with a capacitance controlled oscillator while keeping the connection wires to non-selected capacitive sensors floating in order to be able to sense changes in the coating above the wires.

If the capacitance on the various nodes needs to be limited, for instance due to circuitry or power limitations, it is feasible to place multiple banks of capacitance sensor arrays that can be selected by means of an optional bank select switches. This is explained below with reference to FIGS. 4, 5 and 6.

Figure 4A:
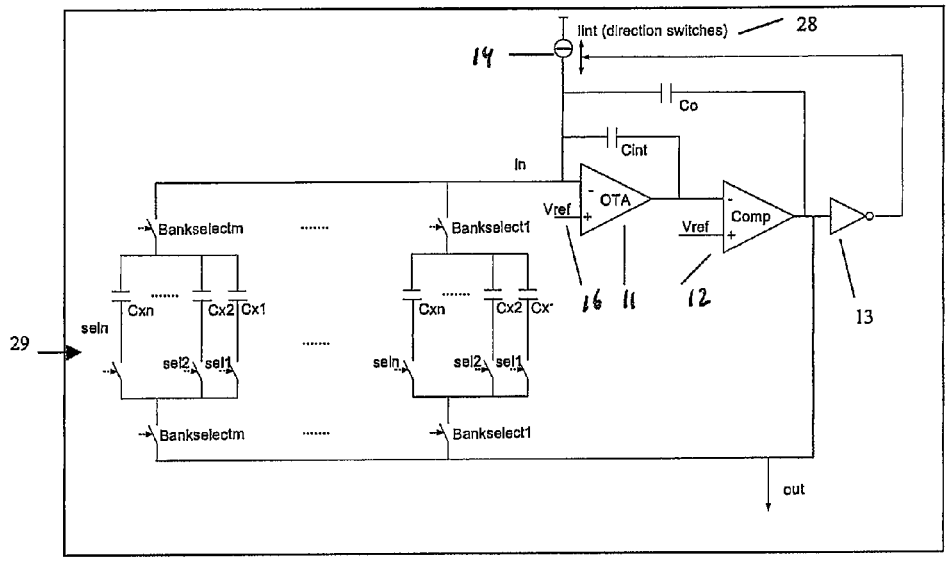
FIG. 4A shows a sensing circuit according to another embodiment.
Figure 4B:
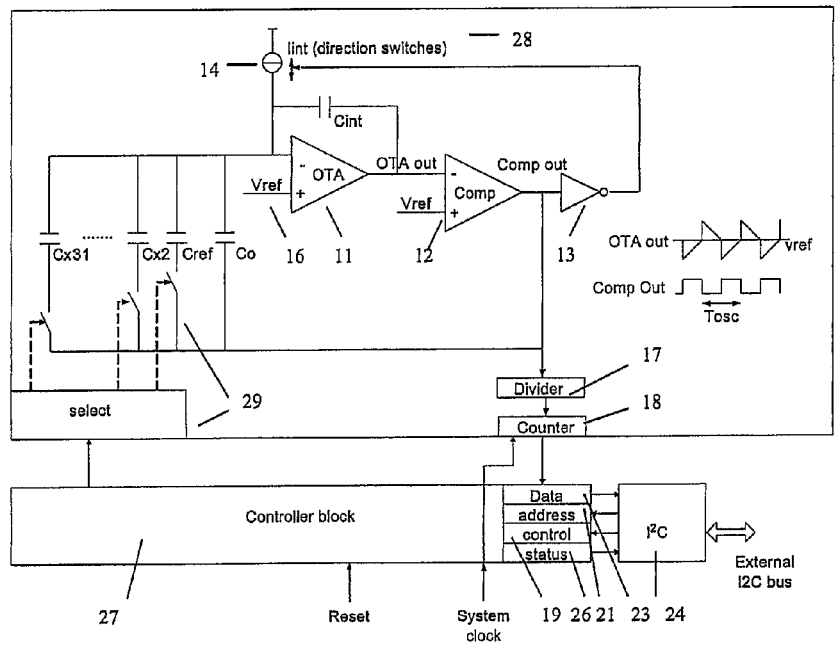
FIG. 4B shows a measurement circuit in accordance with a specific embodiment.
Figure 5:
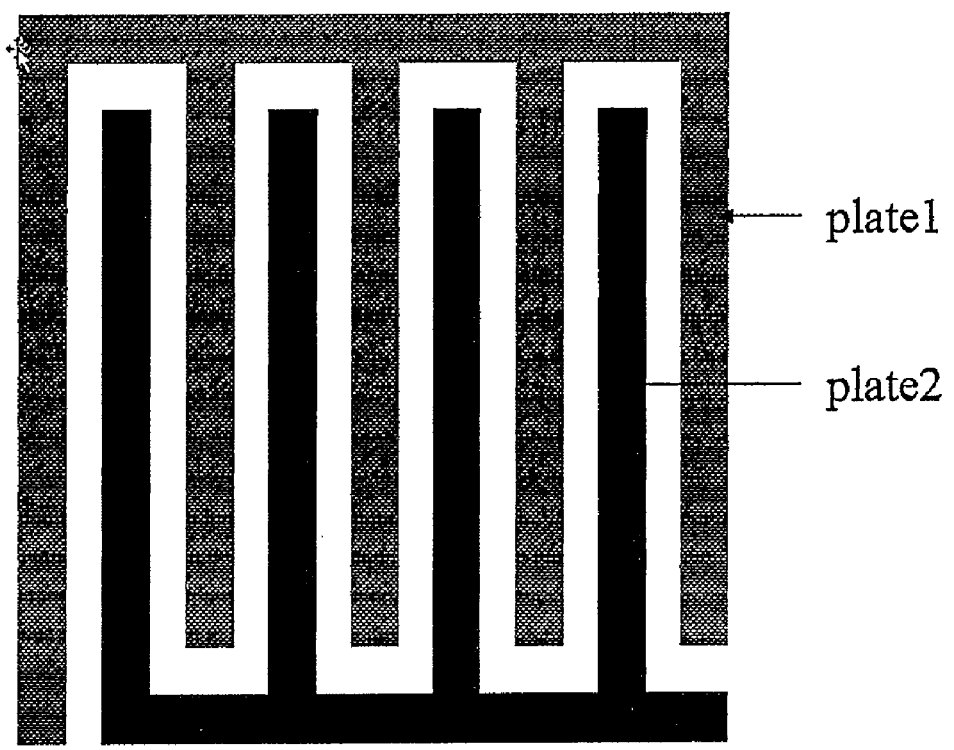
FIGS. 5 and 6 show layouts of sensing electrodes for embodiments of the present invention.
Figure 6:
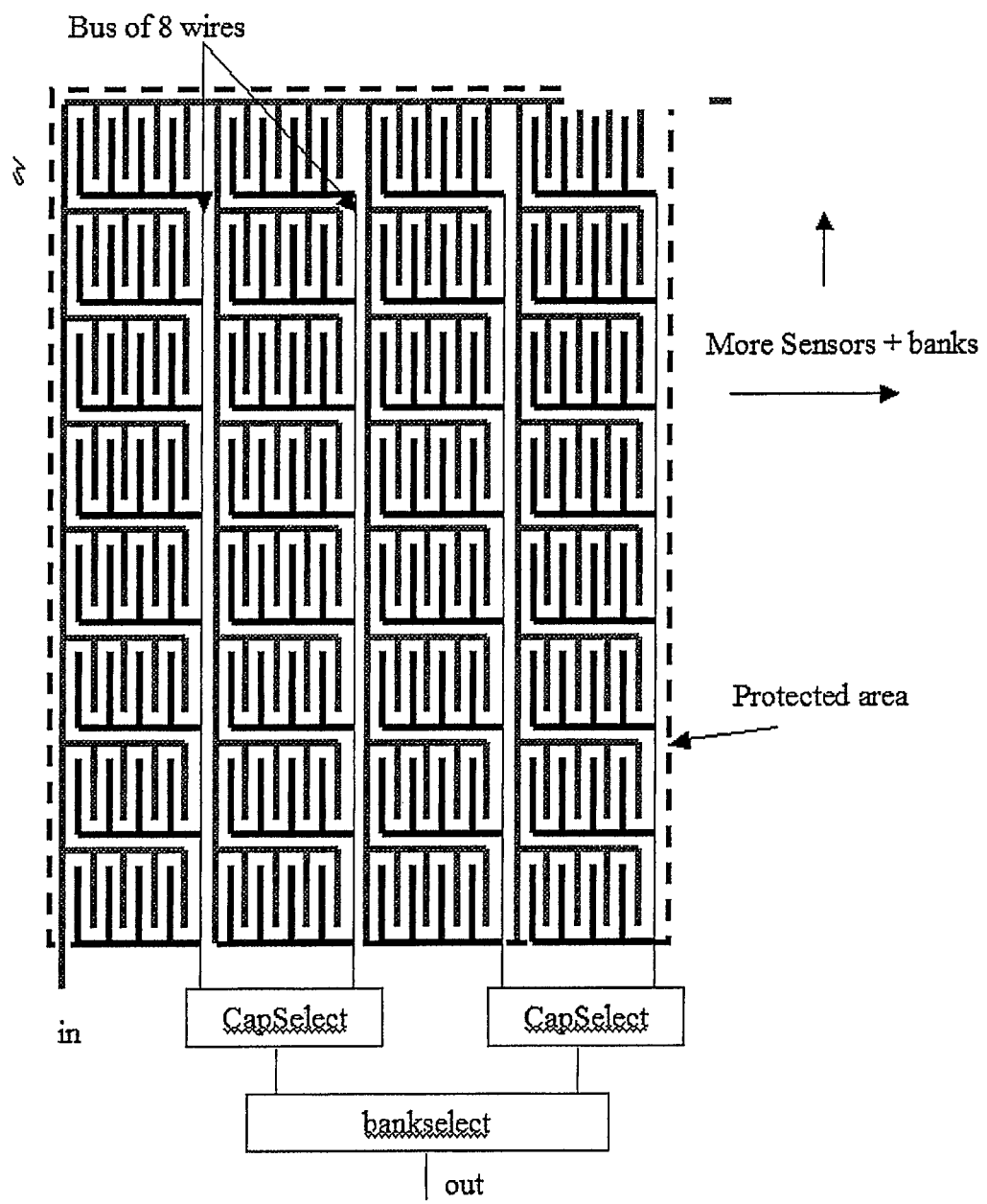

FIGS. 4-6, Sensing Circuit, Electrode Selection

FIG. 4A shows a sensing circuit according to an embodiment in the form of an oscillator, which can be used to feed a counter. The counter is best shown in FIG. 4B. The circuit has power lines and a ground (not shown specifically). The circuit also has a system clock or a system clock signal is provided to the circuit (not shown specifically). The oscillator has an amplifier such as an OTA (operational transconductance amplifier) 11. Its output is fed to a comparator 12, which in turn feeds an inverter 13. The inverter output is fed back to a direction switch 28 for switching current sources Iint 14. A main feedback path is fed from the comparator output back to a negative input of the amplifier 11. The positive input is fed by a reference voltage 16. In this main feedback path is a reference capacitor C0, and one of the capacitances of the parts of the coating to be sensed, shown by Cx1-Cxn. A capacitor Cint is provided in a feedback loop of the amplifier 11 which then functions as an integrator. Parts of the coating are formed into capacitors by means of a plurality of electrodes and these capacitors are shown as formed into banks Electrodes forming each of the capacitors are selected by a selector circuit 29, e.g. comprising selectors (Bankselect1-m, and sel1-seln). Notably, for a given bank, the selectors sel1-seln are only provided on one of the electrodes of each capacitor. This means one of the plates of the non-selected capacitors is left floating.

FIG. 4A can include means for measuring capacitance with a capacitance-controlled oscillator. A notable feature of this kind of two port measurement system is that only the actual capacitance between the two plates is measured. Stray capacitances to ground or other fixed voltages, for example are preferably not taken into account, i.e. not included in the measurement or cancelled out of the measurement.

The output is a certain wave with a certain characteristic frequency which represents the impedance. The frequency can be represented by a number by counting using a counter after the wave has been converted to a binary digital signal. It is then counted how often such a wave occurs within a certain time-frame, e.g. counting the number of clockcycles in e.g. 64 oscillation periods. This is practically a relative measurement in which the capacitance of a security element is measured in comparison to an internal reference capacitance M defined by $(Cm-C0)/(Cint-C0)$. The amplifier compares the input to a reference voltage 16, such as Vdd/2.

A more detailed measurement circuit is shown in FIG. 4B. The CPUF capacitances Cx1-Cxn are measured by means of a switched capacitor relaxation oscillator circuit. This type of measurement method can give high measurement accuracies. FIG. 4B depicts the total architecture of the measurement circuit. It includes:

1. A oscillator measurement circuit inclusive capacitor selection, output divider 17 and a counter 18 for accurate measurement of one or more of the CPUF capacitors Cx1-Cxn. In a main feedback path of the amplifier 11 is a reference capacitor C0, and one of the capacitances of the parts of the coating to be sensed Cx1-Cxn.
2. Address register 21 to determine which capacitor Cx1-Cxn is read out and one or more control registers 19 to set operation modes.
3. One or more data registers 23 in which the measured values of the capacitors Cx1-Cxn are stored.
4. A data interface 24 such as an I2C interface to read out the one or more data registers 23 and to program the address and one or more control registers 21, 19, respectively. Via the one or more control registers 19 a reset of the data registers 23 can be done and a new measurement can be initiated.
5. A controller block 27 that controls correct functionality of the measuremùent circuit e.g. via a status register 26.

The oscillator consists of an OTA 11 switched as integrator (by inclusion of a feedback capacitor device Cint), a comparator Comp (12), a current source Iint (14) with a selectable current direction (e.g. via switches) and a selection for the capacitor that is being measured. When a capacitor is selected, the output of the integrator starts rising or falling due to the current by the current source. As soon as the integrator output reaches the reference voltage Vref the comparator switches the capacitor and also the direction of the current source. Since the comparator switches between supply voltage Vdd and ground potential (ground potential=0) the oscillation period T can be given by the formula $$T=2*(Cx+C0)*Vdd/Iint+Td.$$

Where Td represents the internal delay in the components and Cx is the capacitor to be measured. The oscillation period T is measured by counting the number of system clock periods over multiple oscillation cycles that are defined by the divider 17 (e.g. division N=128). This results in a quantisation error equal to Tclk/(sqrt(6)*Tosc*N) where Tclk is the calculated period, Tosc is the oscillator period and N is the divider ratio.

The circuit of FIG. 4B also includes a reference capacitor Cref that is formed like the CPUF capacitors Cxn from a part of the coating. The capacitors Cx2 to Cx31 and Cref are CPUF capacitances which means the fringe capacitance between the electrode structures represents the top and bottom plates of the capacitors drawn in FIG. 4B. C0 can be a metal capacitor that sets an offset oscillation frequency.

By measuring each time the oscillation frequency for Cref, Co and C1x a so called three signal approach can be applied and effects due to environment, voltage, temperature and circuit inaccuracies can be eliminated by calculating the factor M=(Tx−To)/(Tref−To) where Tref is the period measured with the reference capacitor, Tx is the period measured with the capacitor of interest and To is the period measured with the capacitor C0. The stray capacitors can be relatively big due to routing in order to connect the capacitors Cx. An advantageous feature of the oscillator measurement circuit of this embodiment is that all stray capacitances to power and ground are eliminated in the measurement due to the fixed voltage at the bottom (ideal voltage source) and virtual OTA reference at the top of the capacitance (ideal current source).

A notable advantage of the circuits described with respect to FIGS. 4A and B is that the capacitor formed by a part of the coating is not switched to ground but is within a closed loop. This means a capacitor with a ground plate is not necessary. The interdigitated electrode structure can be implemented as an extension of the structure shown in FIG. 1 in WO2003-046986, using a similar spacing between the individual electrodes. This spacing is advantageous so as to ensure that the inhomogeneous coating may enter the space between the electrodes (so that one gets a more inhomogeneous result), and that the measured capacitance is sufficiently large and suitable for the sensor architecture. It is observed that this architecture is highly insensitive to variations in temperature and frequency:

the temperature compensation is inherent in the relative measurement (the reference capacitor C0 can be a specific security element).

the frequency dependence can be reduced in that the measurement can be carried out in a frequency domain at which the capacitance turns out to be relatively independent of the frequency. This domain is chosen by appropriate selection of the size of the component Co.

The following consequences of this implementation are also notable. No input multiplexers are needed if the absolute size of the capacitance is not essential, merely any change in capacitance, and if the connection wire loads are relatively small. This also makes the layout of the matrix simpler since fewer switches are needed which hence reduces cost, compared to the use of an input multiplexer.

Wires to non-selected capacitive sensors are left floating. The coating influences parasitic capacitances between the connection wires. Changes in the coating above the wires can be detected by the fact that it influences multiple capacitive sensor measurements due to crosstalk effects.

In some embodiments, the capacitive sensors are made in the highest available metal layer, and the passivation insulation between the sensor plates and the coating is made as thin as possible. Other ways are possible, but this way helps avoid the need for a special process option and the sensors can be integrated in all CMOS processes.

By implementing the sensors as comb structures as depicted in FIG. 5, an area efficient way is found to maximize the sensitivity. Local variations and changes in the fringe capacitance would be caused by an attacker making a small hole in the coating. The actual size of and space between the comb fingers is dependent on technology, passivation insulation and coating properties. It can be optimized for the highest fringe capacitance sensitivity and variation (typical 200 fF+−60%) for example. In FIG. 5, an outline of such a capacitance sensor is shown. Plate 1 is connected to the measurement circuit and plate 2 is connected to the selection circuitry.

In order to protect larger areas, it is possible to place multiple. impedances, e.g. capacitive sensors in an array with the connection scheme as depicted in FIGS. 5 and 6. FIG. 6 shows an impedance, e.g. capacitive sensor array of 8 by 4 combs. Any one or more of the impedances, i.e. capacitors, is selected by a selecting device CapSelect, typically implemented as a transistor switch. A pair of columns represents a bank, and either or both of the two banks can be selected by a bank select device, again typically implemented as a transistor switch. Each sensor can be measured separately or together, and the values can be used to verify that no tampering has taken place, either by comparison to values stored on chip, or preferably by comparison to values stored externally. Clearly many other configurations are conceivable. For example the embodiments of the present invention have been described that measure each capacitor Cx one by one by using an appropriate selection of these capacitors. It is included within the scope of the present invention to select multiple capacitors, e.g. groups of capacitors for measurement. Also a plurality of sensing circuits may be provided to measure more than one capacitor Cx simultaneously.

For an area efficient implementation, the capacitive sensors can be placed in the highest metal layer on top of other circuitry, i.e. the one closest to the exposed surface of the device. The circuitry below is then protected from invasive attacks, i.e. invasive attacks can be detected. In order to avoid crosstalk and other effects from the circuitry below, a metal layer in between (the second highest metal layer) can be used as a shield. This should be connected to a stable voltage to avoid crosstalk. Optionally existing supply lines can be used as this shield in order to save area.

Above has been described a capacitive sensor measurement circuit, layout and floor plan architecture for use in devices with secure coatings. The measured values of the sensors can be used to generate a physical identification code. No programming is needed to generate this particular ID code, and to detect attacks. Attacks or changes to the coating will change the measured values and so also the ID code. Embodiments of the invention can find advantageous use in a wide variety of applications, e.g. applied to smart cards, SIM cards of mobile phones, printer cartridge "clever chips", RFID's and any applications that require a secure IC (for example valuable paper documents, identification devices, medicines, content industry such as music, video, games and films).

Particularly the integrated circuit of the invention has an inhomogeneous protective layer or coating over a circuit to be protected, and a sensing circuit arranged to sense a first impedance of a part of the protective coating compared to a reference impedance located on the integrated circuit. The sensing circuit is able to measure a change in the first impedance, e.g. caused by tampering. The sensing circuit has an amplifier having a feedback loop, such that the impedance being sensed is in the feedback loop. The sensing circuit can be incorporated in an oscillator circuit so that the frequency depends on the impedance. Where the impedance is a capacitance, sensing electrodes adjacent to the protective layer or coating, form the capacitance. The electrodes can be arranged as selectable interdigitated comb structures, so that the protective layer or coating extends in between the teeth of the comb structures.

Other variations and applications can be envisaged within the scope of the claims.

The invention claimed is:

1. An integrated circuit having a circuit to be protected, a protective layer over the circuit to be protected, and a sensing circuit arranged to sense a first impedance of a first part of the protective layer compared to a reference impedance located on the integrated circuit, the sensing circuit also comprising an amplifier and a comparator, wherein an output of the amplifier is fed to an input of the comparator, and a main feedback path is fed from an output of the comparator back to an input of the amplifier, such that first and reference impedance being sensed are in the main feedback path.

2. The integrated circuit of claim 1, wherein the reference impedance is formed from a second part of the protective layer.

3. The integrated circuit of claim 1, wherein the sensing circuit is arranged to sense a change in the first impedance.

4. The integrated circuit of claim 1, wherein the sensing circuit is incorporated in an oscillator circuit.

5. The integrated circuit of claim 1, wherein:
the first impedance is a capacitance, and the sensing circuit has sensing electrodes adjacent to the protective layer forming the capacitance; and the reference impedance is a capacitance, and the sensing circuit has sensing electrodes adjacent to the protective layer forming the capacitance.

6. The integrated circuit of claim 5, having a shield layer between the sensing electrodes and the circuit being protected.

7. The integrated circuit of claim 1, wherein the protective layer is an inhomogeneous layer.

8. The integrated circuit of claim 1, wherein the reference impedance is coupled in parallel with the first impedance being sensed.

9. The integrated circuit of claim 1, wherein:
the first impedence is a capacitance, and the sensing circuit has sensing electrodes adjacent to the protective layer forming the capacitance: and
the reference impedance is a capacitance, and the sensing circuit has sensing electrodes adjacent to the protective layer forming the capacitance; and
the sensing electrodes are arranged in a highest of a number of metal layers.

10. The integrated circuit of claim 1, wherein:
the first impedance is a capacitance, and the sensing circuit has sensing electrodes adjacent to the protective layer forming the capacitance; and
the reference impedance is a capacitance, and the sensing circuit has sensing electrodes adjacent to the protective layer forming the capacitance; and
the sensing electrodes are arranged as interdigitated comb structures, so that the protective layer extends in between the teeth of the comb structures.

11. The integrated circuit of claim 1, the sensing circuit is arranged to measure a number of first impedances of different parts of the protective layer.

12. The integrated circuit of claim 11, and having selectors for selecting which of the first impedances are in the feedback loop.

13. The integrated circuit of claim 12, arranged such that connection wires to non-selected first impedances are left floating.

14. An integrated circuit having a circuit to be protected, a protective layer over the circuit to be protected, and a sensing circuit arranged to sense a first impedance of a first part of the protective layer compared to a reference impedance located on the integrated circuit, the sensing circuit also comprising an amplifier and a comparator, wherein an output of the amplifier is fed to an input of the comparator, and a main feedback path is fed from an output of the comparator back to an input of the amplifier, such that first and reference impedance being sensed are in the main feedback path; and
wherein the sensing circuit is incorporated in an oscillator circuit, the oscillator comprising the amplifier coupled to a comparator, the comparator being within the feedback loop.

15. An integrated circuit having a circuit to be protected, a protective layer over the circuit to be protected, and a sensing circuit arranged to sense a first impedance of a first part of the protective layer compared to a reference impedance located on the integrated circuit, the sensing circuit also comprising an amplifier and a comparator, wherein an output of the amplifier is fed to an input of the comparator, and a main feedback path is fed from an output of the comparator back to an input of the amplifier, such that first and reference impedance being sensed are in the main feedback path; and
wherein the sensing circuit is arranged to sense a change in the first impedance; and
the integrated circuit further includes a number of pairs of sensing electrodes for the different parts, arranged in selectable banks of multiple pairs of electrodes.

16. A method of using an integrated circuit having a circuit to be protected, a protective layer being arranged over the circuit to be protected, the method comprising: sensing a first impedance of a part of the protective layer compared to a reference impedance located on the integrated circuit, wherein the sensing circuit comprises an amplifier and a comparator, wherein an output of the amplifier is fed to an input of the comparator, and a main feedback path is fed from an output of the comparator back to an input of the amplifier, such that first and reference impedance being sensed are in the main feedback path.

17. The method of claim 16, including sensing a change in the first impedance.

18. The method of claim 16, further including having the steps of using the amplifier to drive an oscillator and counting the number of oscillations.

19. The method of claim 16, further including the step of converting the measured first impedance to a key value.

20. The method of claim 19, further including the step of transferring the key value or the impedance or an encrypted function of the key off the integrated circuit and validating the key value or the impedance externally.

21. The method of claim 16 further including the step of selecting one or several different parts of the protective layer to be measured.

22. A method of manufacturing an integrated circuit, having the steps of forming a circuit to be protected, forming a protective layer over the circuit to be protected, and forming a sensing circuit to sense a first impedance of a first part of the protective layer and a reference impedance located on the integrated circuit, wherein the sensing circuit also comprises an amplifier and a comparator, wherein an output of the amplifier is fed to an input of the comparator, and a main feedback path is fed from an output of the comparator back to an input of the amplifier, such that first and reference impedance being sensed are in the main feedback path.

23. The method of claim 22, further including the step of measuring the first impedance and recording the measurement externally, with an identifier of the integrated circuit, for use in validating future measurements from the same integrated circuit.

* * * * *